United States Patent
Kang et al.

(10) Patent No.: US 11,409,161 B2
(45) Date of Patent: Aug. 9, 2022

(54) SYSTEMS AND METHODS FOR IMPLEMENTING A DUAL GREEN-BLUE LIGHT-EMITTING DIODE WITH DIFFERENT WAVELENGTHS

(71) Applicant: Dell Products L.P., Round Rock, TX (US)

(72) Inventors: Yong-Gu Kang, Singapore (SG); Eunseok Kim, Singapore (SG)

(73) Assignee: Dell Products L.P., Round Rock, TX (US)

(*) Notice: Subject to any disclaimer, the term of this patent is extended or adjusted under 35 U.S.C. 154(b) by 134 days.

(21) Appl. No.: 17/032,222

(22) Filed: Sep. 25, 2020

(65) Prior Publication Data

US 2022/0100036 A1 Mar. 31, 2022

(51) Int. Cl.
*G02F 1/13357* (2006.01)
*H01L 25/075* (2006.01)
*H01L 33/50* (2010.01)
*H01L 33/48* (2010.01)
*G02F 1/1335* (2006.01)

(52) U.S. Cl.
CPC .... *G02F 1/133603* (2013.01); *H01L 25/0753* (2013.01); *H01L 33/486* (2013.01); *H01L 33/505* (2013.01); *G02F 1/133612* (2021.01)

(58) Field of Classification Search
CPC ................................................. G02F 1/133603
See application file for complete search history.

(56) References Cited

U.S. PATENT DOCUMENTS

| | | | | |
|---|---|---|---|---|
| 7,649,310 B2* | 1/2010 | Ishii | ................... | C09K 11/7789 313/503 |
| 7,964,885 B2* | 6/2011 | Yoo | ..................... | C09K 11/7731 438/22 |
| 10,916,684 B2* | 2/2021 | Lee | ......................... | H01L 33/52 |

* cited by examiner

*Primary Examiner* — Vip Patel
(74) *Attorney, Agent, or Firm* — Jackson Walker L.L.P.

(57) ABSTRACT

A dual green-blue light-emitting diode unit may include a first green-blue light-emitting diode and a second green-blue light-emitting diode. The first green-blue light-emitting diode may include a first green diode configured to emit green light at a first green wavelength, a first blue diode configured to emit blue light at a first blue wavelength, and a first conformal coating of red phosphor over the first green diode and the first blue diode. The second green-blue light-emitting diode may include a second green diode configured to emit green light at a second green wavelength different from the first green wavelength, a second blue diode configured to emit blue light at a second blue wavelength different from the first blue wavelength, and a second conformal coating of red phosphor over the second green diode and the second blue diode.

10 Claims, 2 Drawing Sheets

SYSTEMS AND METHODS FOR IMPLEMENTING A DUAL GREEN-BLUE LIGHT-EMITTING DIODE WITH DIFFERENT WAVELENGTHS

TECHNICAL FIELD

The present disclosure relates in general to information handling systems, and more particularly to a dual-chip light-emitting diode capable of selectively emitting different wavelengths, for use in a liquid crystal display backlight in an information handling system or in other applications.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems often include display devices, either communicatively coupled to an information handling system via a cable or integrated within the information handling system enclosure itself (e.g., in the case of a notebook or tablet computer). One popular way of implementing a display device is as a liquid-crystal display (LCD) illuminated with a light-emitting diode (LED) backlight. One disadvantage of existing LED-backlit LCDs is that a color gamut capable of produced by existing LED-backlit LCDs may not be capable of satisfying multiple color specifications (e.g., AdobeRGB, DCI-P3), while also maintaining applicable energy specifications (e.g., EnergyStar).

SUMMARY

In accordance with the teachings of the present disclosure, the disadvantages and problems associated with traditional light-emitting diodes may be reduced or eliminated.

In accordance with embodiments of the present disclosure, a dual green-blue light-emitting diode unit may include a first green-blue light-emitting diode and a second green-blue light-emitting diode. The first green-blue light-emitting diode may include a first green diode configured to emit green light at a first green wavelength, a first blue diode configured to emit blue light at a first blue wavelength, and a first conformal coating of red phosphor over the first green diode and the first blue diode. The second green-blue light-emitting diode may include a second green diode configured to emit green light at a second green wavelength different from the first green wavelength, a second blue diode configured to emit blue light at a second blue wavelength different from the first blue wavelength, and a second conformal coating of red phosphor over the second green diode and the second blue diode.

In accordance with these and other embodiments of the present disclosure, a light-emitting diode backlight may include a plurality of dual green-blue light-emitting diode units. Each of the plurality of dual green-blue light-emitting diode units may include a first green-blue light-emitting diode and a second green-blue light-emitting diode. The first green-blue light-emitting diode may include a first green diode configured to emit green light at a first green wavelength, a first blue diode configured to emit blue light at a first blue wavelength, and a first conformal coating of red phosphor over the first green diode and the first blue diode. The second green-blue light-emitting diode may include a second green diode configured to emit green light at a second green wavelength different from the first green wavelength, a second blue diode configured to emit blue light at a second blue wavelength different from the first blue wavelength, and a second conformal coating of red phosphor over the second green diode and the second blue diode.

A system may include a display device, the display device comprising a liquid crystal display and a light-emitting diode backlight. The light-emitting diode backlight may include a plurality of dual green-blue light-emitting diode units. Each of the plurality of dual green-blue light-emitting diode units may include a first green-blue light-emitting diode and a second green-blue light-emitting diode. The first green-blue light-emitting diode may include a first green diode configured to emit green light at a first green wavelength, a first blue diode configured to emit blue light at a first blue wavelength, and a first conformal coating of red phosphor over the first green diode and the first blue diode. The second green-blue light-emitting diode may include a second green diode configured to emit green light at a second green wavelength different from the first green wavelength, a second blue diode configured to emit blue light at a second blue wavelength different from the first blue wavelength, and a second conformal coating of red phosphor over the second green diode and the second blue diode.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1 through 3B, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit ("CPU") or hardware or software control logic. Additional components of the information handling system may include one or more storage devices, one or more communications ports for communicating with external devices as well as various input/output ("I/O") devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, service processors, basic input/output systems (BIOSs), buses, memories, I/O devices and/or interfaces, storage resources, network interfaces, motherboards, and/or any other components and/or elements of an information handling system.

Figure 1:
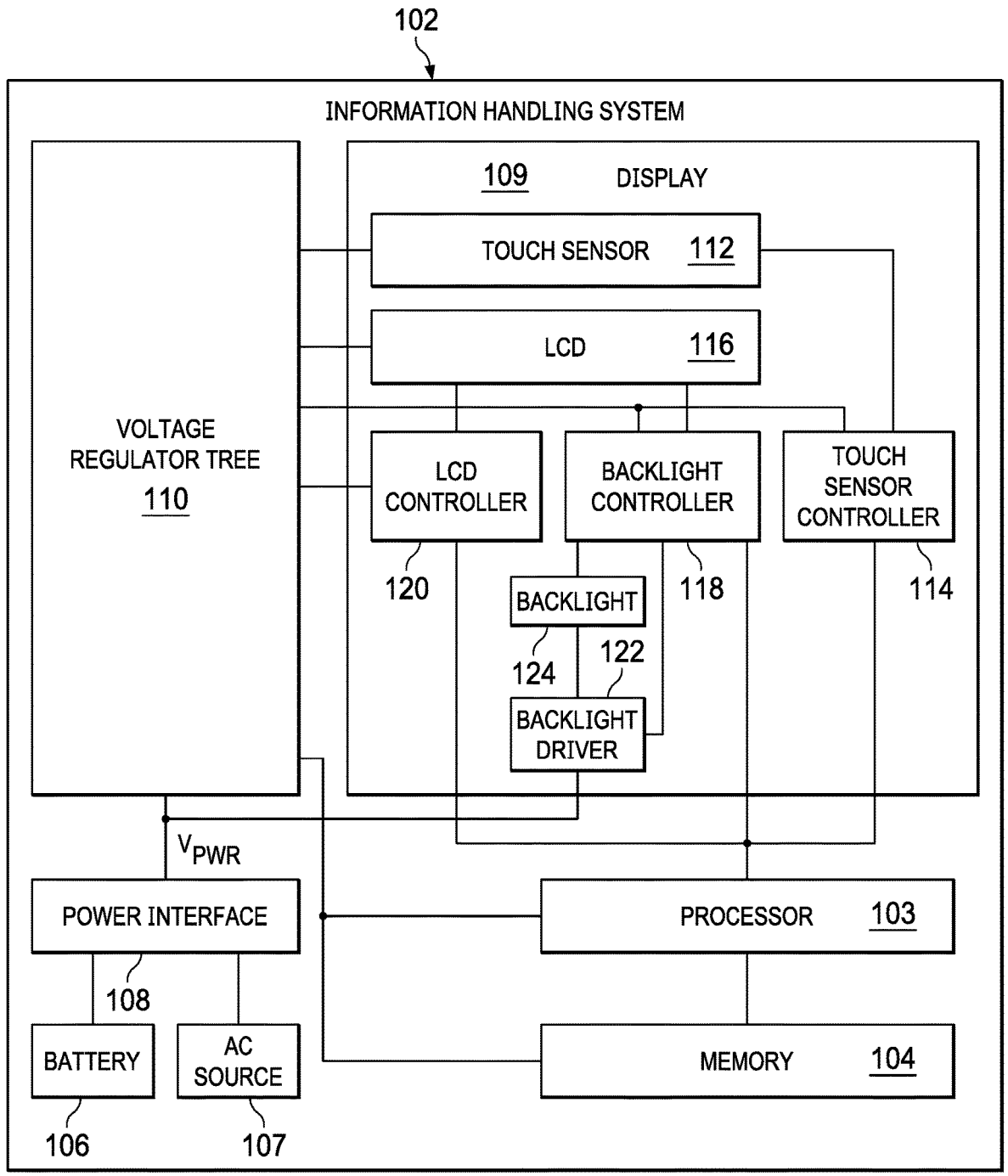
FIG. 1 illustrates a block diagram of an example information handling system, in accordance with certain embodiments of the present disclosure.

FIG. 1 illustrates a block diagram of an example information handling system 102, in accordance with embodiments of the present disclosure. In some embodiments, information handling system 102 may be a mobile device sized and shaped to be readily transported and carried on a person of a user of information handling system 102 (e.g., a notebook or laptop computer, etc.). As depicted in FIG. 1, information handling system 102 may include a processor 103, a memory 104 communicatively coupled to processor 103, a battery 106, an alternating current (AC) source 107, a power interface 108, a display 109, and a voltage regulator tree 110.

Processor 103 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104 and/or another component of information handling system 102.

Memory 104 may be communicatively coupled to processor 103 and may include any system, device, or apparatus configured to retain program instructions and/or data for a period of time (e.g., computer-readable media). Memory 104 may include RAM, EEPROM, a PCMCIA card, flash memory, magnetic storage, opto-magnetic storage, or any suitable selection and/or array of volatile or non-volatile memory that retains data after power to information handling system 102 is turned off.

Battery 106 may comprise any system, device, or apparatus configured to store energy which may be used by information handling system 102 to power components of information handling system 102 to perform the functionality thereof. In some embodiments, battery 106 may comprise an electrochemical cell configured to convert stored chemical energy into electrical energy.

AC source 107 may comprise any system, device, or apparatus configured to provide a direct current (DC) power source derived from an AC power source (e.g., an AC adapter configured to receive an AC input and convert such AC input to a DC voltage).

Power interface 108 may comprise any system, device, or apparatus configured to serve as an electrical interface between power sources (e.g., battery 106 and AC source 107) and voltage regulator tree 110. Accordingly, power interface 108 may include any suitable combination of connectors, cabling, cabling harnesses, and/or other components to provide such an electrical interface. In some embodiments, power interface 108 may be configured to, when an AC input is present, output a voltage $V_{PWR}$ which is provided by AC source 107, and when an AC input is not present, output a voltage $V_{PWR}$ which is provided by battery 106, in order to provide electrical energy to components of information handling system 102.

Display 109 may comprise any instrumentality or aggregation of instrumentalities by which a user may interact with information handling system 102. For example, display 109 may permit a user to input data and/or instructions into information handling system 102, and/or otherwise manipulate information handling system 102 and its associated components. Display 109 may also permit information handling system 102 to communicate data to a user, e.g., by way of a display device. In some embodiments, display 109 may comprise a touch-screen display. When implemented as a touch-screen display, display 109 may comprise touch sensor 112, touch sensor controller 114, liquid crystal display (LCD) 116, backlight controller 118, LCD controller 120, backlight driver 122, and backlight 124.

As known in the art, touch sensor 112 may include any system, device, or apparatus configured to detect tactile touches (e.g., by a human finger, a stylus, etc.) on touch sensor 112 and generate one or more signals indicative of the occurrence of such touches and/or the locations of such touches on the touch sensor 112. In some embodiments, touch sensor 112 may be a capacitive touch sensor configured to detect changes in capacitance induced by tactile touches. In these and other embodiments, touch sensor 112 may be constructed from substantially optically transparent material and placed over LCD 116 or another display apparatus, allowing a user to view graphical elements of the touch display while interacting with touch sensor 112.

Touch sensor controller 114 may be communicatively coupled between touch sensor 112 and processor 103, and comprise any system, device, or apparatus configured to process signals indicative of touches received from touch sensor 112 and translate such signals into signals which may be processed by processor 103. In addition, touch sensor controller 114 may control one or more operating conditions associated with touch sensor 112, including the rate of sampling touches, whether touch sensor 112 is powered on or enabled, and/or other operating conditions.

LCD 116 may comprise any suitable system, device, or apparatus configured to display human-perceptible graphical data and/or alphanumeric data to display 109. As is known in the art, LCD 116 may include an array of liquid crystals configured to modulate light generated by backlight 124 in order to create graphical data and/or alphanumeric data on LCD 116. Although FIG. 1 specifically depicts LCD 116, in some embodiments display 109 may include a display device other than an LCD.

Backlight controller 118 may be communicatively coupled between LCD 116 and processor 103, and comprise any system, device, or apparatus configured to control operation of backlight 124, including controlling an intensity of light generated by such backlight.

LCD controller 120 may be communicatively coupled between LCD 116 and processor 103, and may comprise any system, device, or apparatus configured to, based on graphical data communicated from processor 103 to LCD controller 120, control individual liquid crystals of LCD 116 in order to modulate the light generated by backlight 124, thus creating a display of graphical data and/or alphanumeric data on LCD 116.

Backlight driver 122 may comprise any system, device, or apparatus configured to receive voltage $V_{PWR}$ from power interface 108 and condition such voltage to electrically drive backlight 124.

Backlight 124 may comprise any system, device, or apparatus configured to generate light that may be modulated by LCD 116 in order to generate a display of graphical and/or alphanumeric data. In some embodiments, backlight 124 may be implemented as a plurality of light-emitting diodes (LEDs), such as a plurality of the dual green-blue (GB) LED unit described in further detail below in reference to FIG. 2, below.

Voltage regulator tree 110 may comprise any suitable system, device, or apparatus configured to receive a voltage as an input, and generate from such voltage one or more regulated output voltages to power components of information handling system 102 that may have varying input voltage requirements from each other. Accordingly, voltage regulator tree 110 may include one or more direct current-to-direct current voltage converters, including without limitation one or more buck converters, one or more buck-boost converters, and one or more boost converters.

In addition to processor 103, memory 104, battery 106, interface 108, display 109, and voltage regulator tree 110, information handling system 102 may include one or more other information handling resources. An information handling resource may include any component, system, device or apparatus of an information handling system, including without limitation, a processor (e.g., processor 103), bus, memory (e.g., memory 104), I/O device and/or interface, storage resource (e.g., hard disk drives), network interface, electro-mechanical device (e.g., fan), display, power supply, and/or any portion thereof.

Figure 2:
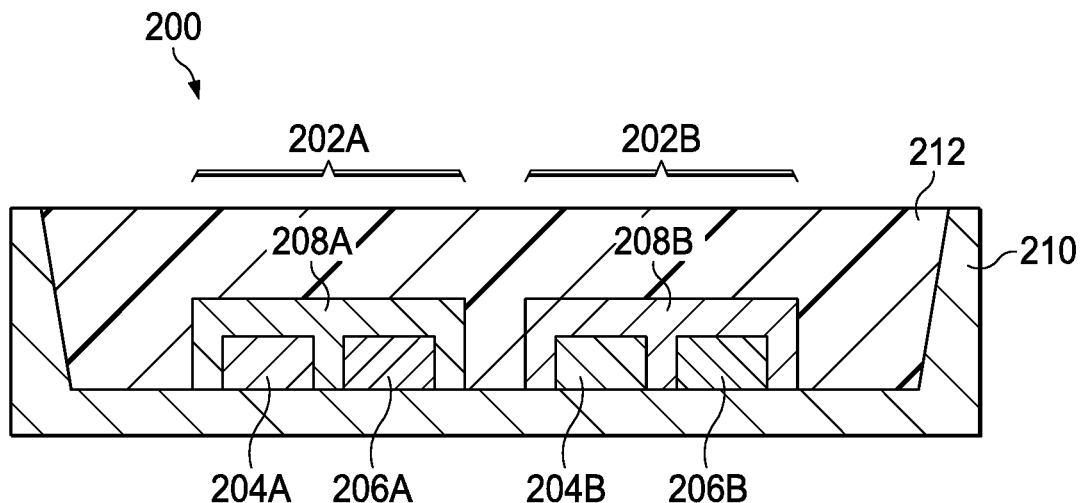
FIG. 2 illustrates a cross-sectional side-elevation view of an example dual green-blue light-emitting diode unit, in accordance with certain embodiments of the present disclosure.

FIG. 2 illustrates a cross-sectional side-elevation view of an example dual GB LED unit 200, in accordance with certain embodiments of the present disclosure. As shown, dual GB LED unit 200 may include two GB LEDs 202 (e.g., GB LED 202A and 202B) housed in a housing 210. Each GB LED 202 may include a respective green diode 204 and blue diode 206 within a respective conformal coating of red phosphor 208. LEDs 202 may further be covered with a layer 212 of encapsulating material (e.g., silicone).

Green diode 204A may be fabricated so as to emit green light at a different wavelength than green light emitted by green diode 204B. In some embodiments, the wavelength of green light emitted by green diode 204A may be longer than the wavelength of green light emitted by green diode 204A. For example, green diode 204A may emit at 535 nm while green diode 204B may emit at 525 nm.

Similarly, blue diode 206A may be fabricated so as to emit blue light at a different wavelength than blue light emitted by blue diode 206B. In some embodiments, the wavelength of blue light emitted by blue diode 206A may be shorter than the wavelength of blue light emitted by blue diode 206A. For example, blue diode 206A may emit at 445 nm while blue diode 206B may emit at 448 nm.

Figure 3A:
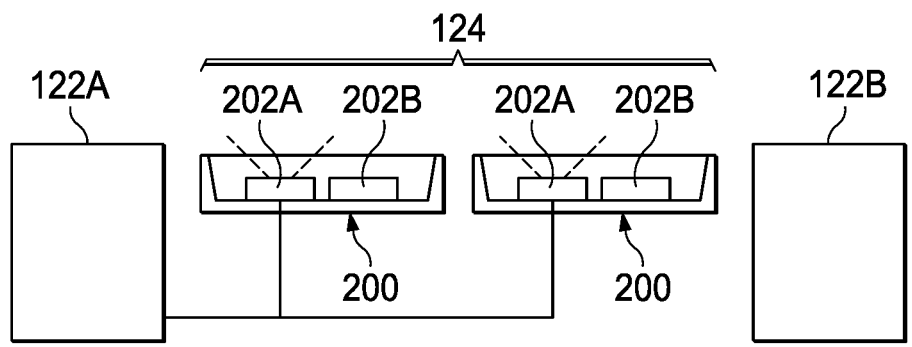
FIGS. 3A and 3B illustrate an example backlight and backlight drivers in different operating modes for the backlight in accordance with certain embodiments of the present disclosure.
Figure 3B:
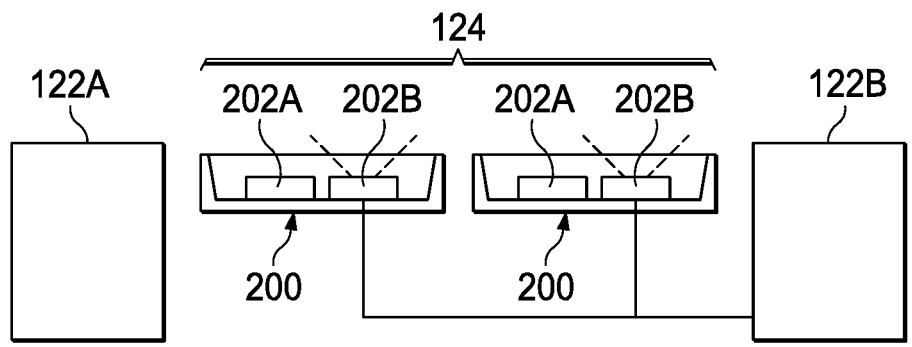

FIGS. 3A and 3B illustrate an example backlight 124 and backlight drivers 122 in different operating modes for backlight 124 in accordance with certain embodiments of the present disclosure. As shown in FIGS. 3A and 3B, a backlight may comprise a plurality of dual GB LED units 200. For purposes of clarity and exposition, FIGS. 3A and 3B depict backlight 124 having only two dual GB LED units 200. However, in actual implementation, backlight 124 may include a larger two-dimensional array of GB LED units 200.

As shown in FIGS. 3A and 3B, a first backlight driver 122A may be coupled to and configured to drive GB LEDs 202A of GB LED units 200 while a second backlight driver 122B may be coupled to and configured to drive GB LEDs 202B of GB LED units 200. In operation, backlight controller 118 may be configured to selectively operate backlight 124 in either of a first mode or a second mode. In some embodiments, selection of operation in either of the first mode or second mode may be based on a preference or setting made by a user of information handling system 102. In the first mode, backlight controller 118 may enable first backlight driver 122A and disable second backlight driver 122B such that GB LEDs 202A may emit light while GB LEDs 202B remain powered off. In the second mode, backlight controller 118 may enable second backlight driver 122B and disable second backlight driver 122A such that GB LEDs 202B may emit light while GB LEDs 202A remain powered off.

Accordingly, the systems and methods described herein may enable a dual GB LED unit 200, and by extension backlight 124 and display 109, to operate in two different color modes. In some embodiments, one of such color modes may satisfy a first industry color specification (e.g., AdobeRGB) while the other of such color modes may satisfy a second industry color specification (e.g., DCI-P3). Further, the existence of two modes that independently satisfy different color specifications, may enable a dual GB LED unit 200, and by extension backlight 124 and display 109, to operate at a lower energy than that which would be required to operate in a single mode of operation that satisfies the various color specifications.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A dual green-blue light-emitting diode unit, comprising:
    a first green-blue light-emitting diode comprising:
        a first green diode configured to emit green light at a first green wavelength;
        a first blue diode configured to emit blue light at a first blue wavelength; and
        a first conformal coating of red phosphor over the first green diode and the first blue diode; and
    a second green-blue light-emitting diode comprising:
        a second green diode configured to emit green light at a second green wavelength different from the first green wavelength;
        a second blue diode configured to emit blue light at a second blue wavelength different from the first blue wavelength; and
        a second conformal coating of red phosphor over the second green diode and the second blue diode.

2. The dual green-blue light-emitting diode unit of claim 1, wherein:
    the first green wavelength is longer than the second green wavelength; and
    the first blue wavelength is shorter than the second blue wavelength.

3. The dual green-blue light-emitting diode unit of claim 1, wherein the dual green-blue light-emitting diode unit is configured such that the first green-blue light-emitting diode and the second green-blue light-emitting diode are selectively enabled and disabled such that:
    the first green-blue light-emitting diode is disabled when the second green-blue light-emitting diode is enabled; and
    the second green-blue light-emitting diode is disabled when the first green-blue light-emitting diode is enabled.

4. A light-emitting diode backlight, comprising:
    a plurality of dual green-blue light-emitting diode units, each of the plurality of dual green-blue light-emitting diode units comprising:
        a first green-blue light-emitting diode comprising:
            a first green diode configured to emit green light at a first green wavelength;
            a first blue diode configured to emit blue light at a first blue wavelength; and
            a first conformal coating of red phosphor over the first green diode and the first blue diode; and
        a second green-blue light-emitting diode comprising:
            a second green diode configured to emit green light at a second green wavelength different from the first green wavelength;
            a second blue diode configured to emit blue light at a second blue wavelength different from the first blue wavelength; and
            a second conformal coating of red phosphor over the second green diode and the second blue diode.

5. The light-emitting diode backlight of claim 4, wherein:
    the first green wavelength is longer than the second green wavelength; and
    the first blue wavelength is shorter than the second blue wavelength.

6. The light-emitting diode backlight of claim 4, wherein each of the plurality of dual green-blue light-emitting diode units is configured such that the first green-blue light-emitting diode and the second green-blue light-emitting diode are selectively enabled and disabled such that:

the first green-blue light-emitting diode is disabled when the second green-blue light-emitting diode is enabled; and the second green-blue light-emitting diode is disabled when the first green-blue light-emitting diode is enabled.

7. A system comprising a display device, the display device comprising:

a liquid crystal display; and a light-emitting diode backlight, comprising:

a plurality of dual green-blue light-emitting diode units, each of the plurality of dual green-blue light-emitting diode units comprising:

a first green-blue light-emitting diode comprising:

a first green diode configured to emit green light at a first green wavelength;

a first blue diode configured to emit blue light at a first blue wavelength; and a first conformal coating of red phosphor over the first green diode and the first blue diode; and a second green-blue light-emitting diode comprising:

a second green diode configured to emit green light at a second green wavelength different from the first green wavelength;

a second blue diode configured to emit blue light at a second blue wavelength different from the first blue wavelength; and a second conformal coating of red phosphor over the second green diode and the second blue diode.

8. The system of claim 7, wherein:

the first green wavelength is longer than the second green wavelength; and the first blue wavelength is shorter than the second blue wavelength.

9. The system of claim 7, further comprising:

a first backlight driver configured to drive the first green-blue light-emitting diodes of the plurality of dual green-blue light-emitting diode units;

a second backlight driver configured to drive the second green-blue light-emitting diodes of the plurality of dual green-blue light-emitting diode units; and a backlight controller configured to operate in a plurality of modes comprising:

a first mode wherein the backlight controller enables the first backlight driver to illuminate the first green-blue light-emitting diodes of the plurality of dual green-blue light-emitting diode units and disables the second backlight driver; and a second mode wherein the backlight controller enables the second backlight driver to illuminate the second green-blue light-emitting diodes of the plurality of dual green-blue light-emitting diode units and disables the first backlight driver.

10. The system of claim 7, wherein:

the system is an information handling system; and the system further comprises a processor communicatively coupled to the display device.

* * * * *